US006689249B2

United States Patent
Ke et al.

(10) Patent No.: US 6,689,249 B2
(45) Date of Patent: Feb. 10, 2004

(54) SHIELD OR RING SURROUNDING SEMICONDUCTOR WORKPIECE IN PLASMA CHAMBER

(75) Inventors: Kuang-Han Ke, Mountain View, CA (US); Bryan Y. Pu, San Jose, CA (US); Hongching Shan, San Jose, CA (US); James Wang, Saratoga, CA (US); Henry Fong, Daly City, CA (US); Zongyu Li, Sunnyvale, CA (US); Michael D. Welch, Livermore, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/947,194

(22) Filed: Sep. 4, 2001

(65) Prior Publication Data

US 2002/0066531 A1 Jun. 6, 2002

Related U.S. Application Data

(60) Division of application No. 09/665,484, filed on Sep. 20, 2000, now Pat. No. 6,284,093, which is a continuation of application No. 08/931,864, filed on Sep. 16, 1997, now abandoned, which is a continuation-in-part of application No. 08/758,531, filed on Nov. 29, 1996, now Pat. No. 5,740,009, and a continuation-in-part of application No. 08/735,444, filed on Jan. 2, 1997, now Pat. No. 6,113,731.

(51) Int. Cl.⁷ .................................................. C23F 1/08
(52) U.S. Cl. .................... 156/345.3; 313/240; 118/504
(58) Field of Search .................... 156/345; 313/609, 313/240; 118/504

(56) References Cited

U.S. PATENT DOCUMENTS 4,767,641 A   8/1988   Kieser et al.
4,948,458 A   8/1990   Ogle
5,074,456 A   12/1991  Degner et al.

(List continued on next page.)

FOREIGN PATENT DOCUMENTS

EP   0 665 575   2/1995

OTHER PUBLICATIONS

Encyclopedia of Semiconductor Technology, Martin Grayson—editor, John Wiley & Sons, 1984, pp. 702 and 805.*
H. Shan et al.; "Process kit and wafer temperature effects on dielectric etch rate and uniformity of electrostatic chuck"; J. Vac. Sci. Tech. B, vol. 14, No. 1; Jan./Feb. 1996; pp. 521–526; USA.

(List continued on next page.)

Primary Examiner—Allan Olsen
(74) Attorney, Agent, or Firm—Robert S. Stern (57) ABSTRACT

A ring or collar surrounding a semiconductor workpiece in a plasma chamber. According to one aspect, the ring has an elevated collar portion having an inner surface oriented at an obtuse angle to the plane of the workpiece, this angle preferably being 135°. This angular orientation causes ions bombarding the inner surface of the elevated collar to scatter in a direction more parallel to the plane of the workpiece, thereby reducing erosion of any dielectric shield at the perimeter of the workpiece, and ameliorating spatial non-uniformity in the plasma process due to any excess ion density near such perimeter. In a second aspect, the workpiece is surrounded by a dielectric shield, and the shield is covered by a non-dielectric ring which protects the dielectric shield from reaction with, or erosion by, the process gases. In a third aspect, the dielectric shield is thin enough to couple substantial power from the cathode to the plasma, thereby improving spatial uniformity of the plasma process near the perimeter of the workpiece. In a fourth aspect, azimuthal non-uniformities in process performance can be ameliorated by corresponding azimuthal variations in the dimensions of the elevated collar and/or the dielectric shield surrounding the workpiece.

20 Claims, 7 Drawing Sheets

U.S. PATENT DOCUMENTS

| | | |
|---|---|---|
| 5,213,658 A | 5/1993 | Ishida |
| 5,225,024 A | 7/1993 | Hanley et al. |
| 5,271,788 A | 12/1993 | Hasegawa et al. |
| 5,275,683 A | 1/1994 | Arami et al. |
| 5,292,399 A | 3/1994 | Lee et al. |
| 5,298,465 A | 3/1994 | Levy |
| 5,304,248 A | 4/1994 | Cheng et al. |
| 5,330,607 A | 7/1994 | Nowicki |
| 5,411,624 A | 5/1995 | Hirano et al. |
| 5,423,918 A | 6/1995 | Gupta et al. |
| 5,474,649 A | 12/1995 | Kava et al. |
| 5,484,486 A | 1/1996 | Blackburn et al. |
| 5,486,975 A | 1/1996 | Shamouilian et al. |
| 5,529,657 A | 6/1996 | Ishii |
| 5,552,124 A | 9/1996 | Su |
| 5,556,500 A * | 9/1996 | Hasegawa et al. ..... 156/345.27 |
| 5,556,501 A | 9/1996 | Collins et al. |
| 5,573,596 A | 11/1996 | Yin |
| 5,673,922 A | 10/1997 | Sherstinsky et al. |
| 5,685,914 A | 11/1997 | Hills et al. |
| 5,740,009 A | 4/1998 | Pu et al. |
| 5,763,020 A | 6/1998 | Yang |
| 5,888,414 A | 3/1999 | Collins et al. |
| 5,891,348 A | 4/1999 | Ye et al. |
| 5,922,133 A | 7/1999 | Tepman et al. |
| 5,942,042 A | 8/1999 | Gogh |
| 5,990,017 A | 11/1999 | Collins et al. |
| 6,024,826 A | 2/2000 | Collins et al. |
| 6,036,877 A | 3/2000 | Collins et al. |
| 6,039,836 A | 3/2000 | Dhindsa et al. |
| 6,074,488 A | 6/2000 | Roderick et al. |
| 6,074,512 A | 6/2000 | Collins et al. |
| 6,284,093 B1 | 9/2001 | Ke et al. |

OTHER PUBLICATIONS

H. Shan et al.; "Process kit and wafer temperature effects on dielectric etch rate and uniformity of electrostatic chuck;" Third International Workshop on Advanced Plasma Tools: Sources, Process Control and Diagnostics; May 4, 1995; San Jose, CA, USA.

* cited by examiner

SHIELD OR RING SURROUNDING SEMICONDUCTOR WORKPIECE IN PLASMA CHAMBER

CROSS REFERENCE TO RELATED APPLICATIONS

This patent application is a continuation of application Ser. No. 09/665,484 filed Sep. 20, 2000, now U.S. Pat. No. 6,284,093, which is a continuation of application Ser. No. 08/931,864 filed Sep. 16, 1997, now abandoned, which is a continuation-in-part of application Ser. No. 08/758,531 filed Nov. 29, 1996 by Bryan Pu et el. entitled "Apparatus for Improving Wafer and Chuck Edge Protection", now U.S. Pat. No. 5,740,009, and a continuation-in-part of application Ser. No. 08/735,444 filed Jan. 2, 1997 by Hongching Shan et al. entitled "Magnetically-Enhanced Plasma Chamber with Non-Uniform Magnetic Field", now U.S. Pat. No. 6,113,731.

FIELD OF THE INVENTION

The invention relates generally to an electrode on which a semiconductor workpiece is mounted in a plasma chamber. More specifically, the invention relates to a collar or ring surrounding the workpiece which can improve the spatial uniformity of a semiconductor fabrication process performed in the chamber.

BACKGROUND OF THE INVENTION

Figure 1:
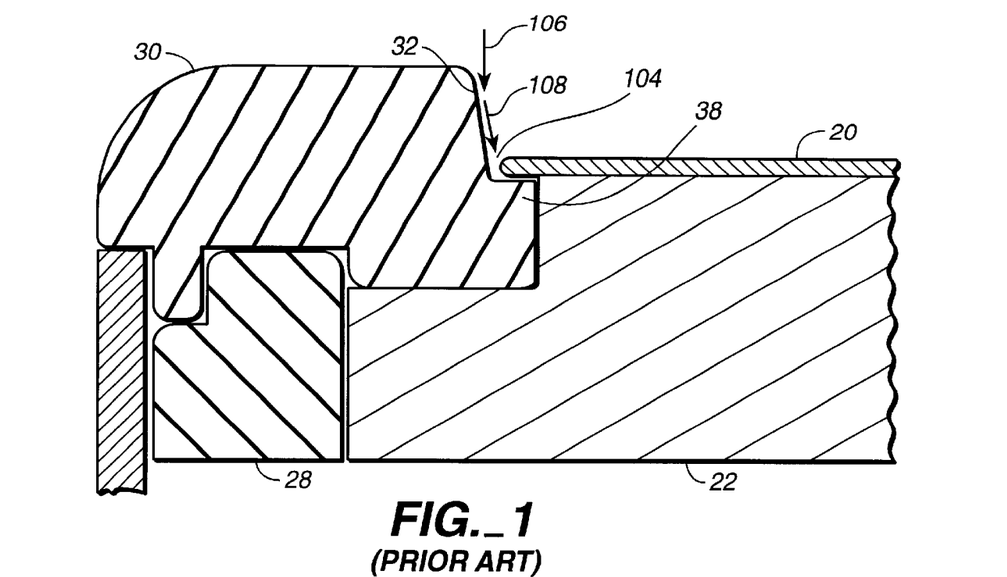
FIG. 1 is a sectional view of a prior art dielectric shield ring.
Figure 2:
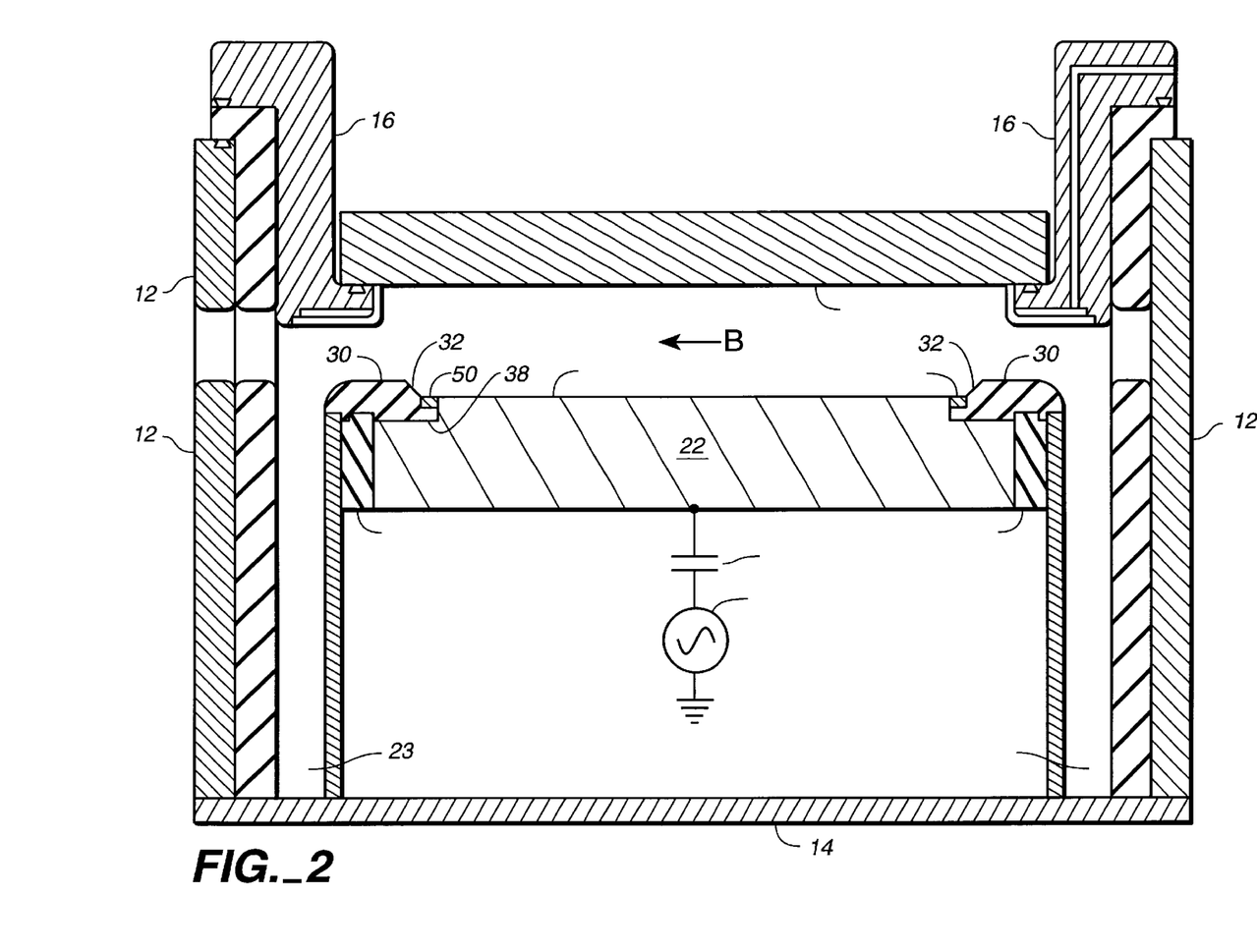
FIG. 2 is a schematic longitudinal sectional view of a plasma chamber according to the invention having a dielectric shield comprising a thick outer dielectric shield and a thin inner dielectric shield, and having a non-dielectric collar covering the inner shield.

Various semiconductor fabrication processes, such as plasma-assisted etching or chemical vapor deposition, are performed in plasma chambers in which a semiconductor workpiece 20 is mounted on a metal electrode 22 (see FIGS. 1 and 2). When the workpiece 20 is a circular semiconductor wafer, the cathode 22 generally has a circular top surface on which the wafer rests. Generally, a mixture of process reagent gases is supplied to the chamber while a pump maintains a vacuum inside the chamber. An electrical power source excites the process gas mixture to a plasma state. Typically, a radio frequency (RF) power supply 24 is capacitively coupled to the electrode 22 so as to produce on the electrode a negative bias voltage relative to the plasma body. The bias voltage attracts ions to bombard the workpiece so as to promote the desired fabrication process. Because it is negatively biased, the electrode 22 often is called the cathode electrode or cathode.

One objective in designing a plasma process chamber is to maximize the reaction rate of the plasma-enhanced process being performed in the chamber. The process rate will be undesirably reduced to the extent any portion of the ion flux from the plasma to the cathode bombards exposed portions of the cathode rather than the workpiece. Accordingly, to concentrate the RF current flow toward the workpiece 20, it is conventional to cover the side of the cathode 22 with a dielectric side shield 28 which is thick enough to present a high electrical impedance to RF current flow between the plasma and the side of the cathode.

In many conventional plasma chambers, the cathode 22 has a substantially larger diameter than the workpiece. To prevent RF current flow between the plasma and the portion of the cathode outside the perimeter of the workpiece, that portion of the cathode conventionally is covered by a dielectric top shield or collar 30. Like the side shield 28, the top shield 30 must sufficiently thick so that its electrical impedance reduces to a negligible level the RF current flow between the plasma and the portion of the cathode outside the perimeter of the workpiece.

One problem with conventional dielectric shields 28, 30 is that, depending on the process chemistry, exposed surfaces of the top shield 30 may be eroded by some of the chemical species present in the plasma, so that the top shield must be replaced periodically. In chambers lacking a top shield 30, side shield 28 may be exposed to the plasma, so that it will suffer the same erosion problem. Frequent replacement is undesirable because it requires suspending the production line while the chamber is shut down. The erosion of the dielectric shield may be especially severe in processes for etching dielectric layers on semiconductor workpieces, because the etchant species which etch the dielectric layer also may etch the dielectric collar.

Another objective in designing a semiconductor process plasma chamber is achieving spatial uniformity of the fabrication process over the surface of the workpiece. For example, in reactive ion etch processes and chemical vapor deposition processes, the process rate (i.e., the etch rate and deposition rate, respectively) may be slower in the center of the workpiece than at the periphery because the reactive species are more depleted near the center of the workpiece then near the periphery. In other words, such a process suffers from radial non-uniformity.

One conventional method of improving the spatial uniformity in the radial dimension is to surround the perimeter of the workpiece with an elevated cylindrical collar or shroud, sometimes called a focus ring. The elevated collar produces at least three effects, the first two of which typically reduce the process rate near the perimeter of the wafer. One effect of the elevated collar or shroud is that it obstructs reactive process gases outside the collar from travelling toward the wafer, so that the collar increases the depletion of reactive species near the wafer perimeter to more closely match the depletion near the wafer center. Another effect of the elevated collar is that it displaces axially upward the plasma sheath outside the workpiece perimeter, thereby moving the plasma sheath further from the workpiece perimeter, and consequently reducing the reactive species concentration near the perimeter of the workpiece. A third effect is that the elevated collar increases the residence time of reactive species near the perimeter of the wafer, which may either increase or decrease the process rate near the wafer perimeter, depending on the chemistry of the particular process being performed.

The elevated collar or shroud need not be a dielectric material to achieve the effects just described. However, if the elevated collar does contain dielectric material, it can also perform the function described earlier of reducing diversion of ion flux from the plasma to portions of the cathode outside the perimeter of the workpiece. In the conventional design shown in FIG. 1, the dielectric collar 30 extends axially above the surface of the wafer so as to combine the previously described functions of both an elevated collar and a dielectric shield.

While conventional elevated collars have been found to improve the spatial uniformity of semiconductor fabrication processes, further improvements in spatial uniformity would be desirable.

SUMMARY OF THE INVENTION

One aspect of the invention is especially useful in oxide etch processes and other plasma-assisted semiconductor fabrication processes which are highly reactive with dielectric materials. In this aspect of the invention, a portion of the cathode electrode which otherwise would be exposed to ion bombardment from the plasma is covered by a dielectric shield, and the shield is covered by a protective ring of non-dielectric material. Preferably, the protective ring is composed of a material which is highly non-reactive with, or resistant to erosion by, the process gases.

Such a protective ring will be eroded at a lower rate than the underlying dielectric, thereby allowing it to be replaced less frequently than a conventional dielectric shield. The protective ring also can prevent reactive species released by reaction of the dielectric ring with the process gases from adversely affecting the semiconductor fabrication process.

Alternatively, instead of being non-reactive with the process gases, the protective ring can be composed of a material which reacts with the process gases in such a way as to not adversely affect the performance of the semiconductor fabrication process.

In oxide etch processes for silicon wafers, the dielectric shield preferably is quartz, and the non-reactive protective ring preferably is silicon.

In a second aspect of the invention, the dielectric shield comprises an axially thick outer shield and an axially thin inner shield surrounding the perimeter of the workpiece. The thick outer dielectric shield provides a relatively high RF impedance to reduce ion flux from the plasma to the portion of the cathode covered by the outer shield. The thin inner dielectric shield provides a lower RF impedance which promotes an ion flux from the plasma to the portion of the cathode just outside the perimeter of the workpiece. Consequently, the thin inner dielectric shield extends the plasma sheath beyond the perimeter of the workpiece, thereby reducing any discontinuity in the plasma sheath near the perimeter. Preferably, the axial thickness of the inner dielectric shield is empirically adjusted to optimize the radial uniformity of the plasma process over the workpiece.

In an optional embodiment of such dielectric shield, a non-dielectric collar covers at least a portion of the thin inner shield and extends axially above the surface of the workpiece. Because it extends above the workpiece surface, the non-dielectric collar can function like a conventional elevated collar or focus ring by obstructing reactive process gases from traveling toward the workpiece, so that the collar increases the depletion of reactive species near the workpiece perimeter to more closely match the depletion near the workpiece center. However, unlike conventional designs, this embodiment of the invention permits the thickness of the inner dielectric shield and the height of the non-dielectric collar to be adjusted independently to better optimize the radial uniformity of the plasma process.

In a third aspect of the invention, a non-dielectric ring encircles and electrically contacts the workpiece. Such a non-dielectric ring can improve the spatial uniformity of the semiconductor fabrication process by reducing or avoiding discontinuities in the plasma sheath near the perimeter of the workpiece.

In a fourth aspect of the invention, azimuthal non-uniformities in process performance can be ameliorated by corresponding azimuthal variations in the dimensions of a dielectric shield and/or an elevated collar surrounding the workpiece.

In a fifth aspect of the invention, erosion of the portion of the process kit adjacent the perimeter of the workpiece is minimized by surrounding the workpiece with a collar having an elevated portion oriented at an angle of 110 degrees to 145 degrees relative to the surface of the workpiece.

DETAILED DESCRIPTION OF THE PREFERRED EMBODIMENTS

1. Conventional Plasma Chamber

FIG. 2 shows a typical semiconductor fabrication process chamber in which the present invention can be used. The illustrated chamber is a magnetically-enhanced plasma chamber suitable for either etching or chemical vapor deposition (CVD).

The vacuum chamber is enclosed by cylindrical side wall 12, circular bottom wall 14, and circular top wall or lid 16. An electrically grounded anode electrode 18 is mounted at the bottom of the lid 16. The anode electrode may be perforated to function as a gas inlet through which process gases enter the chamber. The side wall 12 may be either dielectric or metal. If it is metal, it will function as part of the anode.

The semiconductor wafer or workpiece 20 is mounted on a cathode electrode 22, which, in turn, is mounted in the lower end of the chamber. The workpiece 20 typically is clamped or held against the upper surface of the cathode 22 by a conventional chuck such as a mechanical clamping ring or an electrostatic chuck (not shown). A vacuum pump, not shown, exhausts gases from the chamber through exhaust manifold 23 and maintains the total gas pressure in the chamber at a level low enough to facilitate creation of a plasma, typically in the range of 10 millitorr to 20 torr, with pressures at the lower and higher ends of the range being typical for etching and CVD processes, respectively.

A radio frequency (RF) power supply 24 is connected to the cathode electrode 22 through a series coupling capacitor 26. The RF power supply provides an RF voltage between the cathode electrode and the grounded anode electrode 18 which excites the gases within the chamber into a plasma state. The plasma body has an time-average positive DC potential or voltage relative to the cathode and anode, which accelerates ionized process gas constituents to bombard the cathode and anode electrodes.

To maximize the concentration of reactive species and charged particles at the surface of the wafer 20, and thereby maximize the reaction rate of the plasma-enhanced process being performed in the chamber, as much as possible of the RF current flow between the plasma and the cathode electrode 22 should be concentrated in the area occupied by the wafer 20 on the front surface of the cathode. Therefore, all front and side surfaces of the cathode which are not covered by the wafer are conventionally covered by a thick dielectric. FIG. 2 shows that a dielectric cylinder 28 covers the side surface of the cathode, and that a dielectric shield 30 rests on and covers the top surface of the cathode which is outside the perimeter of the wafer 20. (The dielectric shield 30 and protective ring 50 shown in FIG. 2 are not conventional, but are embodiments of the present invention, as will be described shortly.)

2. Protective Ring to Prevent Erosion of Dielectric Shield

Figure 3:
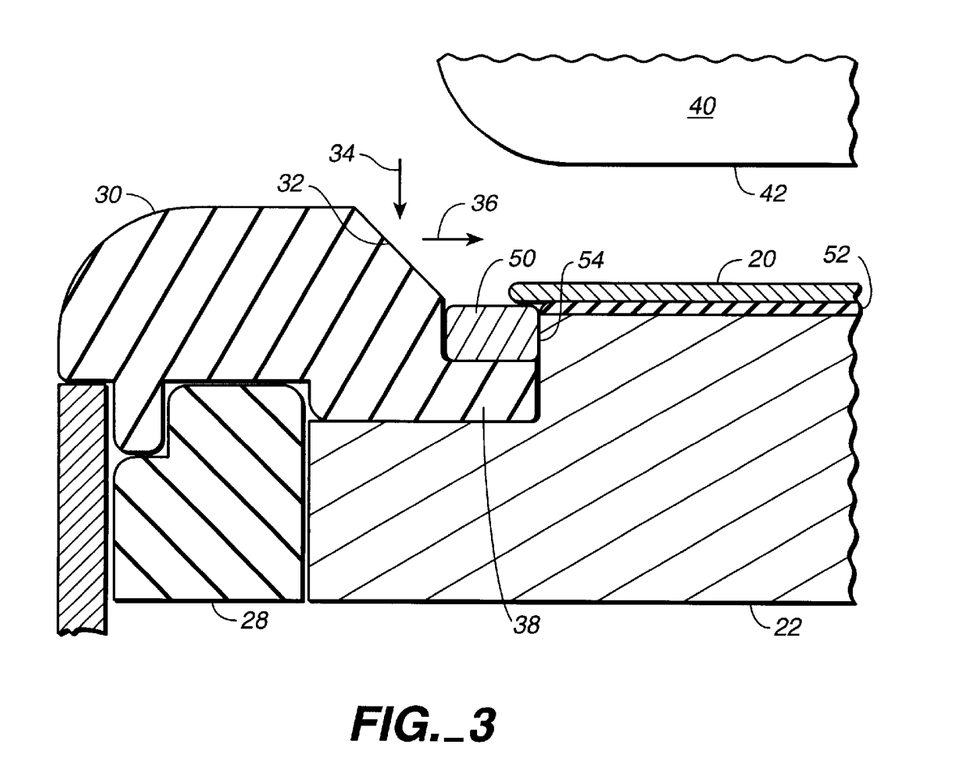
FIG. 3 is a close-up sectional view of the dielectric shield and non-dielectric collar of FIG. 2.

FIGS. 2 and 3 show a protective ring or erosion-resistant ring 50 overlying the radially inner portion 38 of the dielectric shield 30, that is, overlying the dielectric closest to the perimeter of the wafer 20.

The dielectric shield or collar 30 and the protective ring 50 together constitute the "process kit" which must be periodically replaced when either of these two components becomes noticeably eroded. The process kit erodes progressively as successive wafers are processed in the chamber. Because the dimensions of the process kit components affect the plasma density and the distribution of process gases near the edge of the wafer, their progressive erosion changes the characteristics of the semiconductor fabrication process performed in the chamber. Therefore, maintaining process consistency and uniformity generally requires replacing these components when they become significantly eroded.

In a conventional dielectric shield 30 which lacks a protective ring (see FIG. 1), the exposed surface 104 of the dielectric just outside the perimeter of the wafer 20 normally is the portion of the dielectric shield which erodes the fastest. The erosion problem diminishes at points progressively outward from the wafer perimeter because the thick dielectric 30 prevents the plasma from extending significantly beyond the perimeter of the wafer, thereby reducing the ion flux which contributes to erosion.

Depending on the chemistry of the processes performed in the plasma chamber, covering the exposed inner surface 104 of the dielectric shield with an erosion-resistant protective ring 50 can dramatically reduce the erosion, and extend the lifetime, of the process kit.

The inner dielectric shield 38 in the FIG. 3 embodiment is axially thinner and radially wider than in the conventional design of FIG. 1. This is another aspect of our invention which will be explained more fully below. In brief, the inner shield 38 is thin for the purpose of coupling a certain amount of RF power between the cathode 22 and the plasma 40 through the inner shield, thereby extending the plasma radially outward beyond the perimeter of the workpiece 20.

Figure 4:
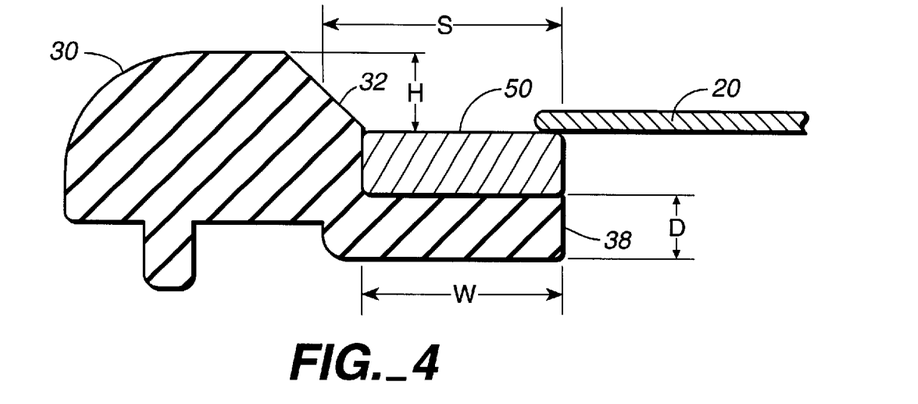
FIG. 4 is a sectional view of an alternative embodiment of the dielectric shield and non-dielectric collar in which the thin inner dielectric shield and the non-dielectric collar are radially wider than in the FIG. 3 embodiment.

FIG. 4 shows another embodiment in which the inner shield 38 is radially wider than in the FIG. 3 embodiment, thereby extending the plasma even further radially outward. Because in both embodiments the inner dielectric shield 38 is thin enough to couple significant RF power between the cathode and the plasma, there will be substantial ion flux from the plasma toward the inner dielectric shield, which would accelerate erosion of any exposed portions of the inner dielectric shield. To prevent such erosion, the protective ring 50 preferably should cover the entire exposed upper surface of the thin, inner portion 38 of the dielectric shield 30.

The erosion-resistant ring 50 should be composed of a material which is more resistant to erosion than the dielectric material of the inner shield 38 in the environment of the particular plasma-enhanced process to be performed in the chamber. If the inner dielectric shield 38 is susceptible to erosion by the process gases, then good candidates for materials which are substantially more erosion-resistant are likely to be non-dielectric materials, such as metals or semiconductors.

In plasma-enhanced processes for etching dielectric layers on a workpiece 20, the process gas constituents which etch the dielectric on the workpiece also are likely to etch the dielectric shield 30. For example, the dielectric shield 30, including the thin inner portion 38, preferably is implemented as a single piece of quartz. Quartz is advantageous because it is available with extremely low impurity concentrations, which is important to avoid releasing contaminants into the process chamber. However, if the dielectric layer on the workpiece which is to be etched is silicon dioxide, then it is chemically identical to quartz, so etch process will also erode the quartz shield 30. Accordingly, in a silicon oxide etch chamber, the protective ring 50 is highly advantageous in protecting the process kit from erosion.

In a silicon oxide etch chamber, the protective ring 50 preferably is composed of pure silicon. Silicon is advantageous because it is resistant to erosion by reactive species generally used in oxide etch processes, and because it readily can be obtained in forms having extremely low impurity concentrations to as to avoid the release of contaminants into the chamber. Single crystal silicon is preferred because it can be obtained with the highest purity.

In our tests using a standard process for etching silicon dioxide layers on silicon wafers, the silicon protective ring 50 etches at a rate at least ten times slower than the etch rate of quartz. When the silicon protective ring begins to acquire a noticeably concave surface due to the erosion, the silicon ring can be readily replaced without replacing the dielectric shield 30. Furthermore, the useful life of the silicon ring can be doubled by inverting it after the top surface becomes concave.

Conversely, if the dielectric inner shield 38 is as erosion-resistant as any other readily available material, then the protective ring 50 can be omitted. For example, the protective ring 50 may be unnecessary in chambers used for etching metal or silicon, because a quartz shield has good resistance to erosion by the reactive species typically used in metal etching and silicon etching.

If the protective ring 50 is a non-dielectric material such as silicon, and if the wafer 20 is electrically insulated from the cathode 22 (as would be the case if the wafer is mounted to the cathode by an electrostatic chuck having a dielectric layer 52 between the cathode and the wafer), then it generally will be beneficial to electrically insulate the non-dielectric protective ring 50 from the adjacent surface 54 of the cathode. If the wafer were insulated from the cathode but the non-dielectric ring were not, the non-dielectric ring would be coupled to the cathode through a lower impedance than the wafer, resulting in excessive RF power being coupled to the plasma through the silicon ring instead of through the wafer.

The electrical insulation between the cathode and the non-dielectric protective ring 50 can be a layer of oxide or other dielectric on the surface 54 of the cathode adjacent the protective ring. In the preferred embodiment, the cathode is aluminum, and the oxide layer is provided by anodizing the entire outer surface of the cathode. Alternatively, the non-dielectric protective ring 50 can be mounted on the dielectric shield so as to maintain a gap between the protective ring and the cathode, so that the vacuum gap provides electrical insulation between the ring 50 and the cathode.

3. Protective Ring to Prevent Dielectric Shield from Altering Process Chemistry

The protective ring 50 just described (exemplified by the two embodiments shown in FIGS. 2–4) can have another advantage besides extending the lifetime of the process kit. In some semiconductor fabrication processes, the dielectric shield 30 reacts with the process gases or is eroded by ion bombardment so as to release chemical species which alter the fabrication process chemistry in the immediate vicinity of the shield, i.e., near the perimeter of the workpiece 20. If the process chemistry (e.g., the proportions of various chemical species) near the perimeter of the workpiece differs from that near the center of the workpiece, the performance of the fabrication process is likely to have corresponding radial non-uniformities. Our protective ring 50 can improve the process spatial uniformity if it is composed of a material which either is much less reactive with the process gases, or else releases chemical species which have a more beneficial (or less detrimental) effect on the fabrication process, as compared to the species released by an unprotected dielectric shield 30.

For example, when a quartz shield 30 is eroded, either by sputtering or by reaction with process gases, it generally releases oxygen. In certain semiconductor fabrication processes, oxygen significantly affects the reaction rate. Specifically, processes for etching hydrocarbons, such as photoresist planarization etching, are accelerated by an increased concentration of oxygen. A similar effect occurs in processes for etching spin-on glass (SOG) dielectric, because SOG typically has a substantial carbon content. For these etch processes, an exposed quartz shield 30 will increase the etch rate near the perimeter of the wafer, thereby degrading spatial uniformity of etch rate.

As another example, the oxygen released by erosion of a quartz shield 30 has a different effect on processes for etching a silicon dioxide layer on a wafer. It is desirable for such etch processes to be as selective as possible against etching any silicon exposed on the wafer. In typical oxide etch processes, oxygen does not promote the etching of silicon dioxide, but it does promote the etching of silicon. Therefore, erosion of the quartz shield 30 typically will degrade the selectivity of the etch process near the perimeter of the wafer.

In both examples, the degradation in spatial uniformity or selectivity near the perimeter of the wafer can be ameliorated by covering the inner portion 38 of the quartz shield 30 with a protective ring 50 composed of a material which will not release chemical species that significantly affect the etch process. As explained earlier, it likely is unnecessary to cover the outer portion of the quartz shield 30 with a protective ring, because the ion flux is declines away from the perimeter of the workpiece, which generally reduces the rate of reaction between the exposed surfaces of the quartz shield and the process gases.

Silicon is a preferred material for protective ring 50 for the same reasons it was described earlier as being effective for extending the lifetime of the process kit, namely, good resistance to erosion by reagents typically used for etching dielectrics and metals, and ready availability with low impurity levels. Silicon has an additional advantage for improving uniformity in etch processes that use fluorine-containing reagents such as $CF_4$ or $CHF_3$. High concentrations of fluorine ions in the plasma generally reduce the selectivity of the etch process. Silicon reacts with and consumes ("scavenges") fluorine ions, so that providing silicon material adjacent the workpiece reduces the fluorine ion concentration adjacent the workpiece. For example, in processes for etching silicon oxide, the presence of a silicon ring 50 is believed to improve the etch selectivity toward photoresist; i.e., it is believed to reduce the photoresist etch rate.

Figure 7:
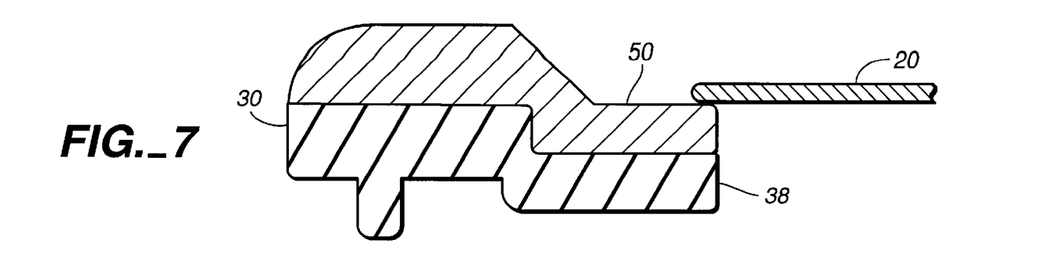
FIG. 7 is a sectional view of an embodiment in which a non-dielectric protective collar covers the entire upper and inner surfaces of the dielectric shield.

FIG. 7 shows an alternative design similar to the FIG. 4 design, except that the protective ring 50 covers a much greater portion of the exposed surface of the dielectric shield 30, thereby increasing the area of the dielectric shield 30 that is protected from erosion. Specifically, the illustrated protective ring 50 covers all upward facing surfaces and all inward facing surfaces of the dielectric shield 30. Consequently, the FIG. 7 design further advances both previously described functions of the protective ring 50, namely, extending the lifetime of the process kit, and reducing spatial non-uniformities of the semiconductor fabrication process caused by chemical interaction between the dielectric shield 30 and the process gases.

Figure 5:
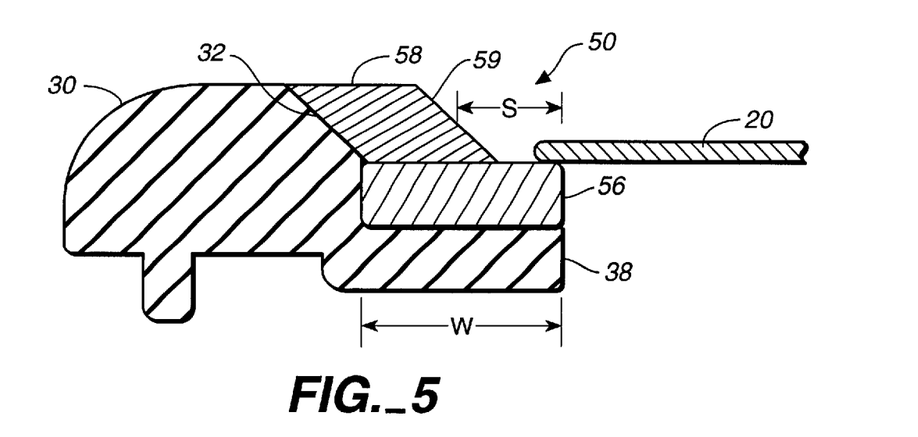
FIGS. 5 and 6 are sectional views of two additional embodiments of the invention further comprising a second non-dielectric collar extending axially higher than the surface of the wafer, the second ring having greater axial height in the FIG. 5 embodiment than in the FIG. 6 embodiment.
Figure 6:
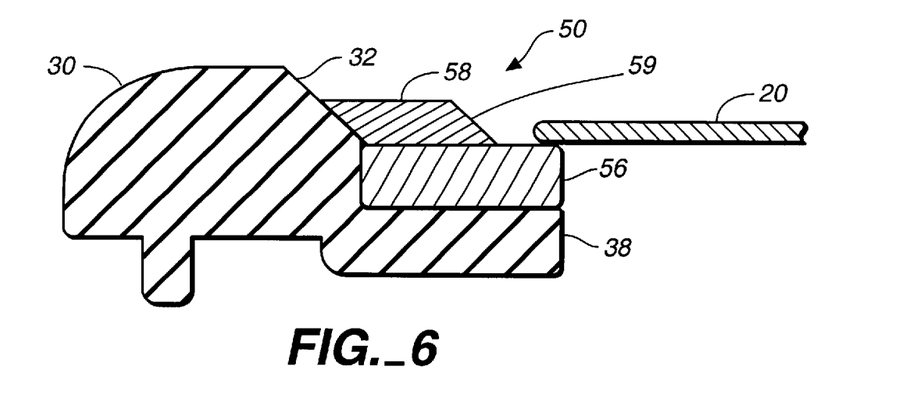

FIGS. 5 and 6 show further alternative designs which are intermediate between the designs of FIGS. 4 and 7, in that the protective ring 50 covers more of the dielectric shield than in the FIG. 4 design, but less than in the FIG. 7 design. Specifically, in FIGS. 5 and 6 the protective ring 50 comprises a lower ring 56 and an upper ring 58, where the latter partially or entirely covers the inwardly facing elevated surface 32 of the dielectric shield 30. Depending on the process, the design of FIGS. 5 or 6 may adequately protect the dielectric shield 30 from eroding and thereby altering the process chemistry.

We expect the FIG. 7 design will be especially advantageous in semiconductor fabrication processes which are strongly affected by oxygen released from erosion of a quartz dielectric shield 30. As stated earlier, such processes include photoresist planarization etching processes and spin-on glass etching processes. Increasing the area of the quartz shield 30 which is covered by the protective ring 50 should further reduce the release of oxygen from the quartz. Such release would increase the etch rate near the perimeter of the workpiece relative to the center of the workpiece, thereby degrading the spatial uniformity of the etch rate over the workpiece surface.

Preferably, the protective shield 50 is composed of silicon, which has the further advantage of scavenging fluorine ions as described earlier. In a process for etching silicon oxide using fluorine-containing reagents, the FIG. 7 design, because it increases the surface area of the silicon shield 50 which is exposed to the plasma, should further reduce the concentration of fluorine ions adjacent the workpiece, thereby improving the selectivity of the etch process.

One potential disadvantage of increasing the exposed surface area of the silicon shield is that its effect on the etching process becomes more significant, which then makes its temperature sensitivity more significant. Within the range of temperatures normally encountered in a plasma etch chamber, increasing the temperature of the silicon shield will increase its reactivity with fluorine. Therefore, in designs in which the silicon shield has a large surface area exposed to the plasma, it may become necessary to regulate the temperature of the silicon shield to ensure good process repeatability.

4. Dielectric Shield with Lower Impedance Portion Near Workpiece

As explained above in the Background of the Invention, the conventional dielectric shield 30 shown in FIG. 1 performs two functions. First, the dielectric shield is thick enough in the axial dimension to provide a high electrical impedance to RF power coupling between the cathode electrode 22 and the plasma through the dielectric. Minimizing such RF power coupling outside the perimeter of the workpiece 20 maximizes the rate of the fabrication process being performed on the workpiece. Second, the dielectric shield 30 extends axially above the surface of the workpiece so as to improve radial uniformity of the process performance by reducing the difference between reactive species concentrations near the wafer perimeter and those near the wafer center.

We have found that the spatial uniformity of the fabrication process over the surface of the wafer 20 often can be further improved by providing an annular area surrounding the wafer through which RF power is coupled from the cathode electrode 22 to the plasma 40. Such RF coupling is accomplished by providing the dielectric shield 30 with an inner portion 38 whose RF impedance is substantially less than that of the surrounding portion of the dielectric shield. RF power coupled between the cathode electrode 22 and the plasma through the relatively low impedance of the inner dielectric shield 38 causes the plasma sheath 42 to extend radially beyond the perimeter of the workpiece 20. This minimizes any discontinuity of the plasma sheath near the perimeter of the workpiece, thereby enhancing the radial uniformity of the plasma-assisted semiconductor fabrication process being performed on the workpiece.

The remainder of the dielectric shield 30 surrounding the inner portion 38 has a substantially higher electrical impedance to minimize coupling of RF power to regions too far from the workpiece to significantly contribute to the fabrication process being performed on the workpiece. RF power coupling outside the perimeter of the workpiece can be minimized by increasing the thickness (i.e., axial height) of the elevated collar 30 and by fabricating it of a dielectric material having a lower dielectric constant. Quartz is a suitable dielectric material for the elevated collar 30 because it is readily available with very low impurity levels to as to minimize the release of contaminants into the chamber.

The electrical impedance of the inner dielectric shield 38 can be made less than that of the remaining outer portion of the dielectric shield 30 by making the inner shield 38 substantially thinner in the axial dimension, as illustrated in FIG. 3. In the preferred embodiment, the dielectric shield 30 is a single piece of quartz fabricated in the illustrated shape which is thinner at the inner portion 38. Alternatively, the electrical impedance of the inner dielectric shield 38 can be reduced by fabricating it of a material having a higher dielectric constant than the remaining outer portion of the shield 30.

In practice, the electrical impedances of the inner and outer portions of the dielectric shield 30 will vary with RF frequency. The impedances we refer to in this patent specification are those at the frequency of the RF power source 24 connected to the cathode 22, this frequency being 13.56 MHz in the preferred embodiment.

We believe the dimensional parameters of the process kit which most strongly affect the spatial uniformity of the etch rate are the axial thickness or depth D of the thin, inner dielectric shield 38, the radial width W of the thin, inner dielectric shield 38, the height H above the wafer of the elevated portion 30 of the process kit, and the spacing S between the elevated portion and the wafer perimeter. (The reference letters D, W, H, and S appear only in FIG. 4, but apply equally to the other embodiments.)

The RF power capacitively coupled between the cathode electrode 22 and the plasma 40 through the inner dielectric shield 38 is inversely proportional to the electrical impedance of the inner dielectric shield. Such impedance is proportional to the radial width W divided by the depth D of the thin, inner dielectric shield 38, and is inversely proportional to the dielectric constant of the material of the inner dielectric shield. The coupling of RF power produces a corresponding increase in charged particle concentration in the plasma pre-sheath and sheath 42 above the inner dielectric shield 38, which produces a corresponding increase in ion flux toward the inner dielectric shield.

It may be desirable to experiment with dielectric shields and protective rings having different dimensions and shapes to determine which design provides the best combination of spatial uniformity and throughput for a particular semiconductor fabrication process. As mentioned at the beginning of this section, RF power coupled from the cathode to the plasma outside the area occupied by the wafer diminishes the concentration of ions and reactive species at the wafer surface. Therefore, whatever improvement in spatial uniformity is achieved by increasing the coupling of RF power through the thin, inner dielectric shield 38 should be balanced against the resulting decrease in the average rate (i.e., throughput) of the process being performed on the wafer.

For example, FIG. 4 shows a dielectric inner shield 38 and a non-dielectric protective ring 50 whose radial width W is much greater than that of the embodiment shown in FIG. 3. (To simplify the drawings, FIGS. 4–6 do not show the cathode electrode 22 located below the dielectric inner shield 38 and the wafer 20 as in FIG. 3.) The FIG. 4 design may be preferable to the FIG. 3 design in order to extend the plasma sheath radially further beyond the edge of the wafer so as to reduce any spatial non-uniformities of the process near the edge of the wafer.

We measured the etch rate and etch rate uniformity of a standard silicon dioxide etch process to compare the designs of FIGS. 3 and 4 in which the radial width of the dielectric inner shield 38 was 6 mm and 14 mm, respectively. (The thickness D of the dielectric inner shield was 4 mm in both cases.) In our tests, the uniformity did not differ very significantly between the designs of FIGS. 3 and 4. As expected, the etch rate was slightly lower with the FIG. 4 design because more RF power was diverted through the inner dielectric shield to regions away from the wafer 20. Therefore, at least for this particular process, we prefer the FIG. 3 design.

The effect of the height H of the elevated portion 30 of the process kit is more complex. In most configurations, the predominant effect of the elevated portion is the "shadow" effect or "depletion" effect wherein the elevated portion 30 obstructs reactive process gases outside the collar from travelling toward the wafer. Consequently, the depletion effect increases the depletion of reactive species near the wafer perimeter to more closely match the depletion near the wafer center. Generally, increasing the depletion of active species near the wafer perimeter decreases the process rate near the perimeter. Secondly, the elevated portion produces a "confinement" or "residence time" effect in which it increases the residence time of reactive species near the perimeter of the wafer, which may either increase or decrease the process rate near the wafer perimeter, depending on the chemistry of the particular process being performed. Thirdly, the elevated portion of the shield produces a "focusing" effect which increases the ion flux near the perimeter of the wafer because ions 34 accelerated downward from the plasma sheath collide with inwardly facing surface 32 of the elevated portion and ricochet 36 toward the wafer (see FIG. 3). The focusing effect is strongly dependent on the angle between the wafer surface and the face 32 of the elevated portion which faces the wafer, where a 135° angle (45° from vertical) would be expected to produce the greatest deflection of ions toward the center of the wafer. A fourth effect of the elevated collar is to displace axially upward the plasma sheath outside the workpiece perimeter, thereby moving the plasma sheath further from the workpiece perimeter, and consequently reducing the reactive species concentration near the perimeter of the workpiece.

The preceding paragraph discussed the effect of the height H on process rate. The "depletion" effect and the "residence time" effect additionally affect other process performance parameters such as selectivity in an etch process or film quality in a deposition process. The present invention provides more options for optimizing these performance parameters by allowing the RF coupling beyond the workpiece perimeter to be adjusted independently of the height of the elevated collar 30 (the "depletion" and "residence time" effects being controlled by the latter).

The depletion effect, residence time effect, focusing effect, and plasma displacement effect all tend to be more pronounced as the height H is increased. All of these effects also are affected by the radial spacing S between the inward face 32 of the elevated portion and the perimeter of the wafer. The focusing effect is expected to be maximized at a certain spacing S (which must be empirically determined), whereas the other three effects progressively decrease with increasing spacing S.

FIG. 5 shows another alternative design in which the non-dielectric protective ring 50 consists of a flat ring 56 like the ring 50 of FIG. 4, over which is placed a second non-dielectric ring 58 which extends higher than the surface of the wafer 20 and which has inner and outer surfaces angled at 45° from the vertical like the inner surface 32 of the elevated shield 30. The elevated non-dielectric ring 58 provides physical confinement of the reactive species near the edge of the wafer in a manner similar to the similarly positioned inner surface 32 of the elevated dielectric shield 30 shown in FIG. 3. However, in contrast with the dielectric shield 30 of the FIG. 3 design, the second non-dielectric ring 58 in FIG. 5 imposes a relatively small electrical impedance between the RF-powered cathode 22 and the plasma, thereby preserving the higher level of RF coupling through the thin inner dielectric shield 38 of the FIG. 4 design.

By substituting a different elevated non-dielectric ring 58 having a different radial width, the spacing S can be altered independently of the width W of the inner dielectric 38, thereby providing an additional design parameter for optimizing the spatial uniformity of the semiconductor fabrication process.

FIG. 6 shows another alternative design which differs from the FIG. 5 design in that the axial height of the second non-dielectric ring 58 is only half that of the elevated collar 30, thereby providing an intermediate amount of physical confinement of the reactive species near the edge of the wafer.

The second non-dielectric ring 58 shown in FIGS. 5 and 6 overlaps the inner surface 32 of the dielectric elevated collar 30 so as to provide a gradual transition of electrical impedance as a function of radial position, thereby enhancing the uniformity of the plasma sheath near the edge of the wafer, hence enhancing the spatial uniformity of the semiconductor fabrication process. To further reduce any discontinuity in the plasma sheath, the radially outer portion of the second non-dielectric ring 58 has a progressively diminishing, tapered thickness as it overlaps the inner portion 32 of the dielectric elevated collar 30, thereby providing a gradual transition in electrical characteristics from the silicon ring to the elevated collar.

Another factor affecting the desired impedance of the dielectric inner shield 38 is whether the chamber uses an electrostatic chuck 52 (see FIG. 3) to hold the wafer 20 on the cathode electrode 22. If so, the electrostatic chuck interposes a dielectric between the cathode and the wafer, which therefore interposes a capacitive impedance between the cathode and the plasma. To maintain a given balance between the RF power coupled through the wafer and the power coupled through the thin, inner dielectric shield 38, the impedance of the inner dielectric shield should be increased in proportion to the RF impedance of the electrostatic chuck. The impedance of the inner dielectric shield 38 is proportional to its axial thickness D divided by its radial width W, and is inversely proportional to its dielectric constant.

Because the electrical impedance of the illustrated silicon protective ring 50 is much less than that of the inner dielectric shield 38, we expect the axial depth D (i.e., thickness) of the protective ring to have no substantial effect on the coupling of RF power between the cathode electrode and the plasma, and hence no substantial effect on the ion flux distribution over the wafer. In practice, the silicon ring should be thick enough to prevent accidental breakage when it is installed by maintenance personnel. Also, a thicker silicon protective ring can withstand more erosion before it should be replaced.

EXAMPLE

We compared the conventional dielectric shield 30 of FIG. 1 against our inventive design of FIG. 4 comprising a protective ring 50 and an improved dielectric shield 30 having a thin, inner portion 38.

Figure 9A:
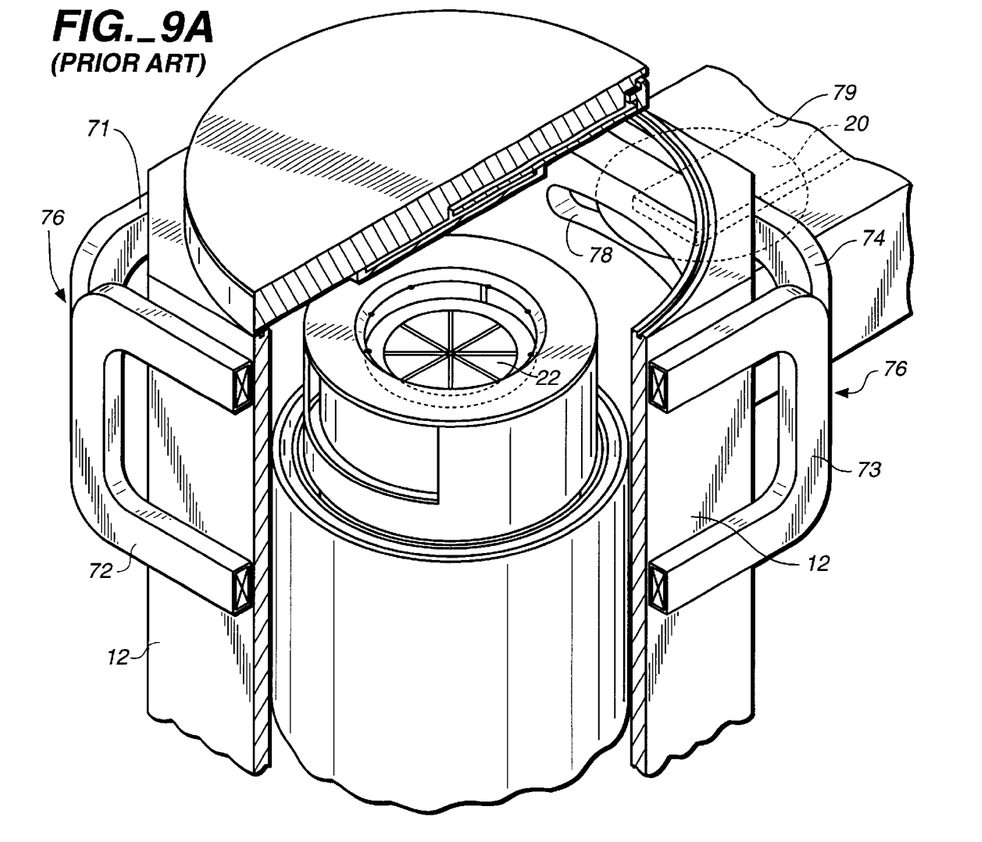
FIG. 9A is a partially cut-away, perspective view of a prior art MERIE chamber.
Figure 9B:
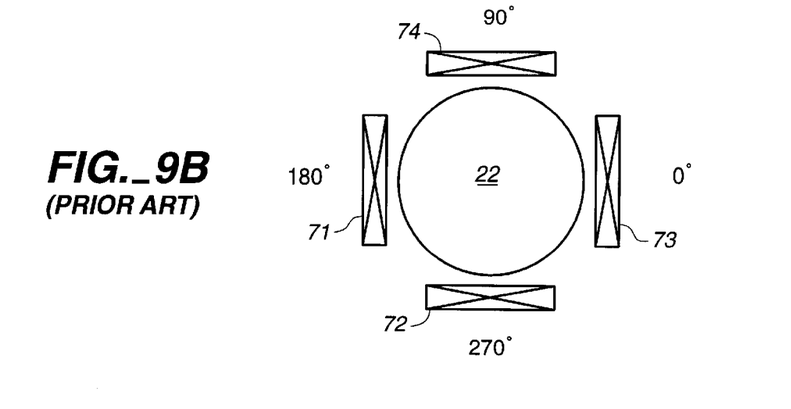
FIG. 9B is a schematic top view of the electromagnets of the chamber of FIG. 9A.
Figure 10A:
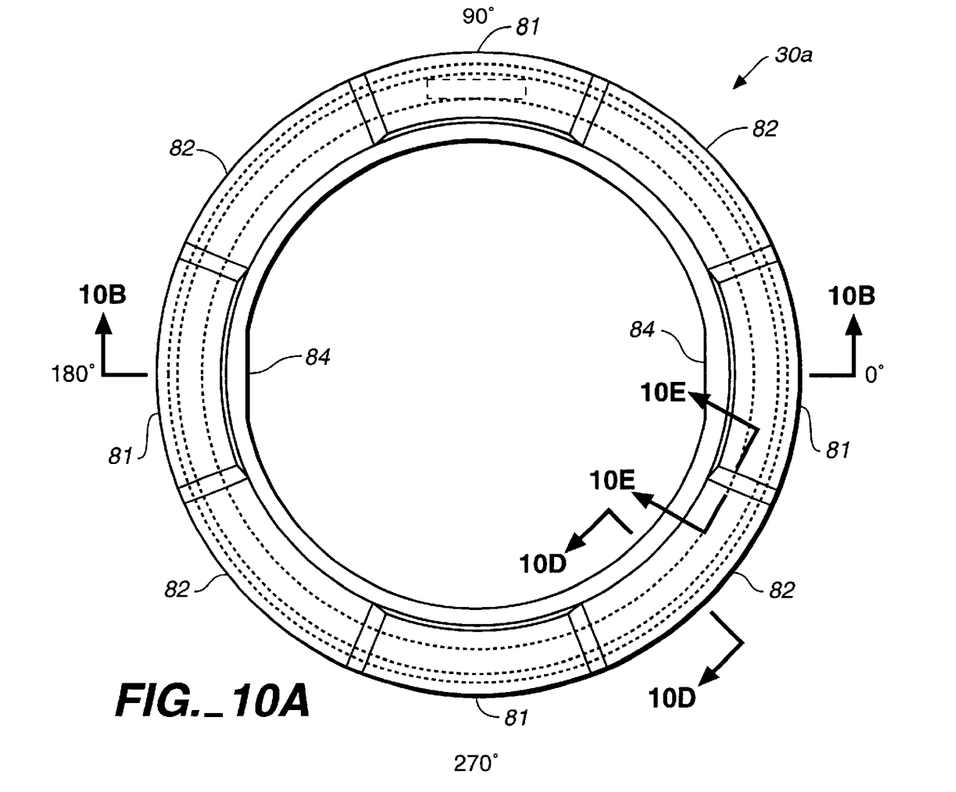
FIG. 10A is a top view of a wavy collar according to the invention.
Figure 10B:
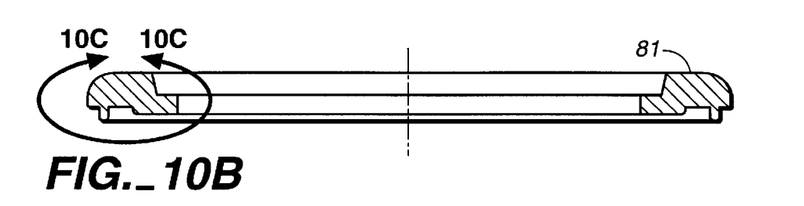
FIGS. 10B–10E are sectional views of the wavy collar.
Figure 10C:
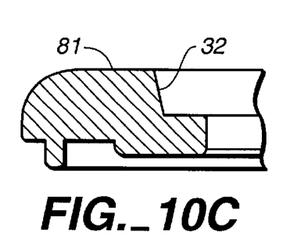
Figure 10D:
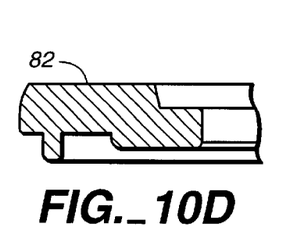
Figure 10E:
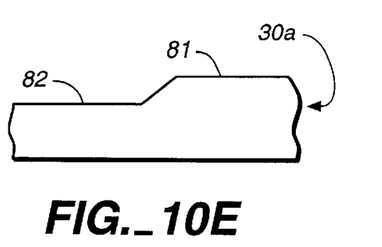

The tests were performed using a process for etching a layer of silicon dioxide from a 200 mm diameter silicon wafer 20 in the magnetically-enhanced plasma chamber depicted in FIGS. 9A and 9B. A DC power supply supplied 4 A of current to each of two adjacent electromagnet coils 71 and 74, so that the magnetic field strength at the center of the wafer was about 30 G. No current was supplied to the other two coils 72, 73. The process gas flow was 45 sccm $CHF_3$, 15 sccm $CF_4$, and 150 sccm Ar. The chamber pressure was 200 mT. The RF power supply 24 supplied 1000 watts of power at 13.56 MHz to the cathode 22. Each wafer was etched for 60 seconds, resulting in about 4000 Å to 4400 Å of silicon dioxide being etched from the wafer surface.

Figure 11A:
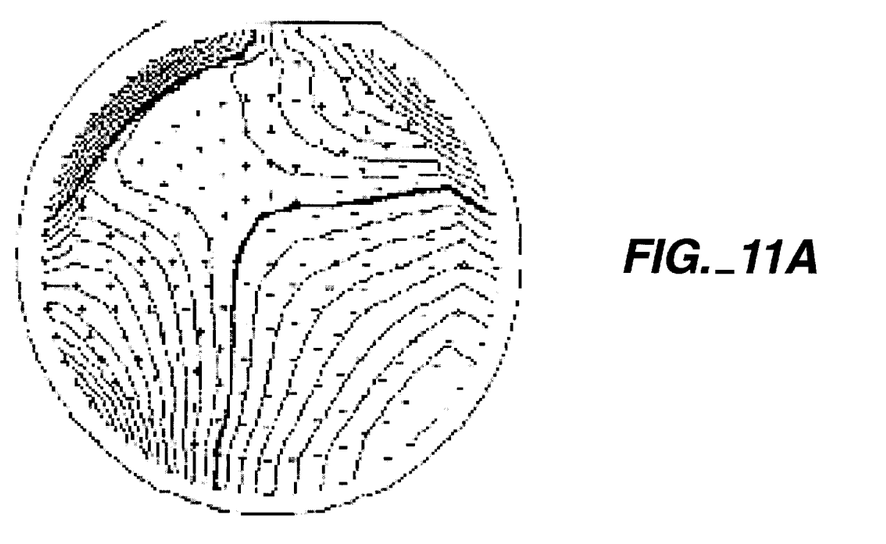
FIGS. 11A and 11B are isometric charts of the etch rate over the surface of a wafer using the conventional dielectric shield of FIG. 1 and the novel dielectric shield of FIG. 4, respectively.
Figure 11B:
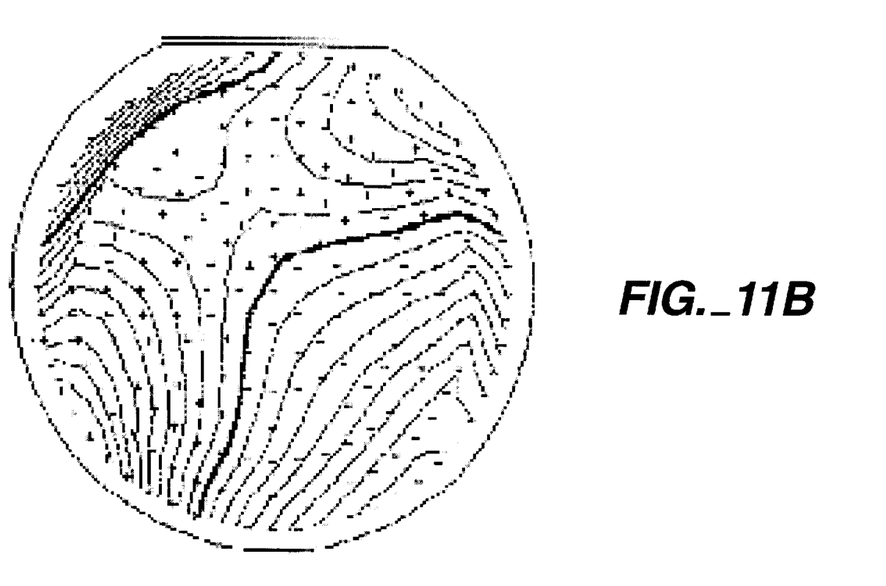

FIGS. 11A and 11B are isometric charts generated by an interferometer showing differences in the etch rate over the surface of the wafer. The heavy black isometric lines represent the mean etch rate. Plus signs and minus signs represent areas having etch rates greater and less than the mean, respectively. The increment between each isometric line is 100 Å/min.

FIG. 11A shows the results for the conventional dielectric shield shown in FIG. 1, which had a thickness or depth D equal to 8 mm below the edge of the wafer and equal to 15 mm at the elevated portion of the shield outside the perimeter of the wafer. FIG. 11B shows the results for the improved dielectric shield 30 of FIG. 4 which had a thin, inner portion 38 whose radial width W was 14 mm and whose thickness or depth D was 4 mm.

In comparison with the conventional design of FIG. 1, the improved dielectric shield of FIG. 4 reduced the deviation from the mean of the minimum and maximum etch rates, the worst negative deviation from the mean being reduced from −1060 to −850 Å/min., and the worst positive deviation from the mean being reduced from +1250 to +1050 Å/min.

5. Non-Dielectric Ring Electrically Contacting Wafer

Figure 8A:
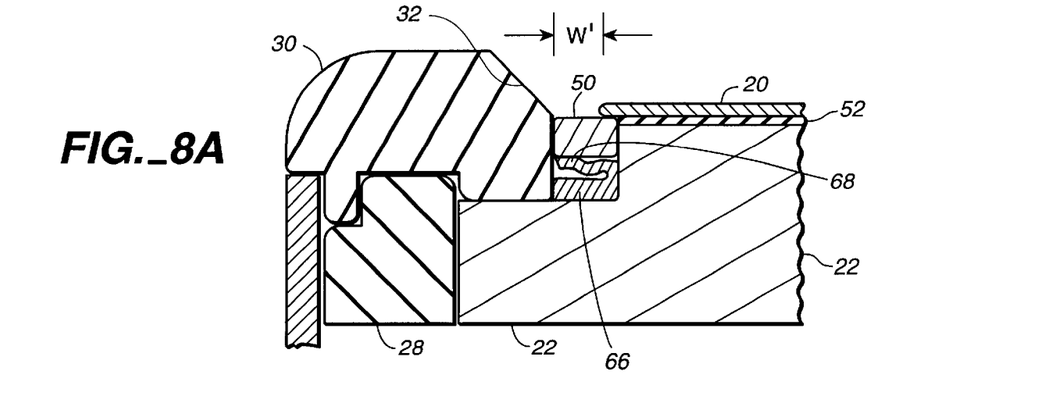
FIG. 8A is a sectional view of an embodiment in which a spring pushes a non-dielectric ring into good electrical contact with the wafer.
Figure 8B:
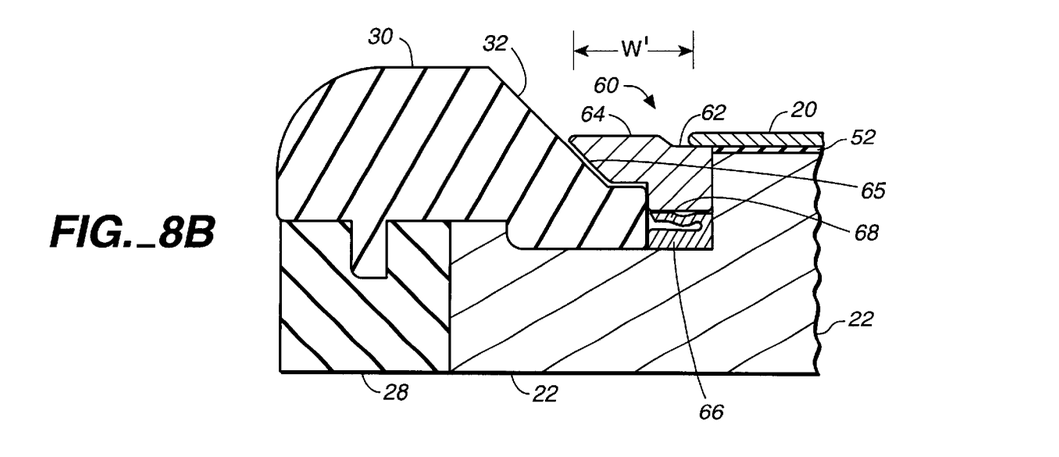
FIG. 8B is a sectional view of an embodiment having a more complex shaped non-dielectric ring than the embodiment of FIG. 8A.

FIGS. 8A and 8B show alternative process kit designs in which the semiconductor workpiece or wafer 20 presses against, and electrically contacts, the surrounding non-dielectric ring 50 or 60. To ensure good electrical contact, the process kit includes a spring or elastomer to apply uniform pressure between the wafer 20 and the non-dielectric ring 60. In the embodiments shown in FIGS. 8A and 8B, the elastomer is an O-ring having a stationary lower portion 66 and a movable, elastic lip seal 68 which applies upward pressure against the non-dielectric ring 50 or 60, thereby pressing the non-dielectric ring against the wafer.

In the FIG. 8A design, the non-dielectric ring 50 is the same as in the FIG. 3 design, but the inner portion 38 of the dielectric shield 30 is replaced by the elastomer 66, 68. The FIG. 8B design employs a distinctive non-dielectric ring 60 which will be described below.

In the designs of both FIGS. 8A and 8B, because the non-dielectric ring electrically contacts the wafer, the non-dielectric ring effectively becomes an electrical extension of the wafer, and hence an electrical extension of the cathode electrode 22. Consequently, these designs do not need any dielectric inner shield 38 to cover the portion of the cathode electrode beneath the non-dielectric ring 60.

To maximize the continuity of the plasma sheath above the edge of the wafer 20, the non-dielectric ring 50 or 60 preferably should be composed of the same material as the wafer substrate. Specifically, if the workpiece 20 is a silicon wafer, the non-dielectric ring preferably is silicon.

In the designs of FIGS. 8A and 8B, the RF power coupled through the silicon ring 50 or 60 is proportional to the radial width W' by which the silicon ring 50 or 60 extends outside the perimeter of the workpiece 20. The coupled RF power also is inversely proportional to the electrical resistance of the silicon ring. This contrasts with the designs of FIGS. 3–7 in which such power is proportional to the width W of the inner dielectric shield 38.

To prevent the elastic ring 66, 68 from moving out of position when the wafer 20 is removed, the stationary lower portion 66 of the elastic ring preferably should fit snugly between the dielectric shield 30 and the cathode electrode 20.

Since the silicon ring 50 or 60 should be free to move up and down, there will be some gap between the silicon ring and the dielectric shield 30. This gap preferably should be small enough to prevent the plasma from penetrating the gap and reaching the spring 68, the edge of the electrostatic chuck 52, and the underside of the wafer 20. It is sufficient for the gap to be less than the width of the plasma sheath, which, as is well known, is a function of chamber pressure and other factors.

In the absence of a downward clamping force on the wafer 20, the spring or elastomer 68 pushes the silicon ring 60 upward to elevate it above the top surface of the electrostatic check 52. Therefore, when a wafer 20 is first carried into the chamber and deposited on the electrostatic chuck 52, the wafer will rest on the elevated silicon ring 60 rather than on the electrostatic chuck. If the resulting gap between the wafer bottom surface and the chuck top surface is too great, the chuck will not be able to produce sufficient electrostatic force on the wafer to overcome the spring force of the elastomer 68 so as to clamp the wafer against the top surface of the chuck. To prevent this problem, the elastomer 68 should have a limited upward extension so as to elevate the silicon ring 60 and the wafer 20 only a slight amount before the electrostatic chuck is turned on. The maximum permissible elevation of the un-chucked wafer will be greater if the elastomer has a weaker spring coefficient or if the electrostatic chuck is stronger. We estimate that the elevation of the un-chucked wafer in our prototype was about 0.003 to 0.010 inch (0.08 to 0.25 mm) above the electrostatic chuck 52. However, it is difficult to measure the wafer's elevation while a vacuum is present in the chamber.

Conversely, if the wafer is chucked to the cathode electrode by a mechanical clamp rather than by an electrostatic chuck, there is no need to limit the amount by which the elastomer elevates the silicon ring.

If the wafer 20 is electrically insulated from the cathode, as would be the case if the wafer is mounted to the cathode by an electrostatic chuck having a dielectric layer 52, then it is important to electrically insulate the silicon ring 50 or 60 from the cathode. The latter insulation may be afforded by anodizing the surface of the cathode if the cathode is aluminum. If the wafer were insulated from the cathode but the silicon ring were not, the silicon ring could be coupled to the cathode through a lower impedance than the wafer, resulting in excessive RF power being diverted through the silicon ring instead of the wafer.

We performed tests comparing the embodiments of FIG. 3 and FIG. 8A in an otherwise conventional plasma etch chamber. In a process for etching silicon dioxide film on a silicon wafer, we measured about 30 percent better spatial uniformity of etch rate with the FIG. 8A design as compared with the FIG. 3 design.

FIG. 8B shows an embodiment having a non-dielectric ring 60 whose shape is more complex than that of the simple annular non-dielectric ring 50 of the FIG. 8A embodiment.

One distinctive feature of the FIG. 8B design is that the silicon ring 60 has a stepped upper surface. Specifically, the portion 64 of the silicon ring 60 which is outside the perimeter of the wafer 20 has an upper surface which is slightly raised relative to the upper surface of the portion 62 of the silicon ring which lies beneath the wafer. The raised upper surface 64 is raised just enough to be coplanar with the upper surface of the wafer so as to minimize any discontinuity in the plasma sheath adjacent the perimeter of the wafer, thereby enhancing spatial uniformity of the process being performed on the wafer.

To further reduce any discontinuity in the plasma sheath, the outer portion 64 of the silicon ring has a progressively diminishing, tapered thickness as it overlaps the inner portion 32 of the dielectric elevated collar 30, thereby providing a gradual transition in electrical characteristics from the silicon ring to the elevated collar.

In our tests, these features of the FIG. 8B design did not produce measurably better spatial uniformity of etch rate than the simpler design of FIG. 8A. Because its silicon ring 50 is easier to manufacture, and because the silicon ring can be flipped upside down to double its service life when it becomes eroded, we currently prefer the FIG. 8A design.

6. Azimuthal Variation in Dimensions of Collar or Dielectric Shield

The spatial uniformity of a plasma-enhanced semiconductor fabrication process may be impaired by asymmetries or non-uniformities in the shape or mechanical layout of components of the process chamber. More specifically, if the workpiece is a circular semiconductor wafer, the process will have azimuthal non-uniformities if the process chamber components are not cylindrically symmetrical relative to the axis of the wafer. In one aspect of our invention, these azimuthal non-uniformities can be offset by corresponding azimuthal variations in the dimensions of an elevated collar and/or a dielectric shield which surrounds the workpiece.

FIGS. 9A and 9B show a conventional process chamber having two sources of cylindrical asymmetry. The illustrated chamber is the magnetically-enhanced reactive ion etch (MERIE) chamber which is described in detail in commonly-assigned U.S. Pat. No. 5,534,108 to Qian et al., the entire contents of which are hereby incorporated by reference into this patent specification. The chamber wall 12 has a cylindrical inner surface and an outer surface whose transverse cross section is octagonal. Arrayed around the chamber wall are four electromagnet coils 71, 72, 73, 74 mounted on alternate faces of the octagonal outer surface. A power supply, not shown, supplies an electrical current to the four electromagnets so as to produce a magnetic field which is parallel to the plane of the wafer and which slowly rotates about the axis of the wafer. (FIG. 9A shows the top surface cathode 22 without a wafer 20 mounted on it. The plane of the wafer is essentially the same as the plane of the illustrated top surface of the cathode 22.) The slow rotation is accomplished by driving the electromagnets in "quadrature", i.e., by supplying a low frequency sinusoidal current to the four magnetic coils, with the sinusoidal current applied to the first and third coils 71, 73 being 90° out of phase with the sinusoidal current applied to the second and fourth coils 72, 74.

The reason for rotating the magnetic field is to maximize the azimuthal symmetry of the etch process performed on the wafer. However, azimuthal asymmetries remain because, as stated in the aforementioned Qian et al. patent, the time-averaged magnetic field near the axis of each electromagnet (i.e., at azimuths of 0°, 90°, 180°, and 270°) is less than the time-averaged magnetic field near the locations 76 closest to the edges of adjacent electromagnet coils (i.e., at azimuths of 45°, 135°, 225°, and 315°). Consequently, the process rate near the perimeter of the wafer is lower at azimuths which are multiples of 90° than at azimuths which are odd multiples of 45°.

An additional azimuthal asymmetry in the chamber shown in FIG. 9A arises from the aperture or slit 78 in the chamber wall through which a robot arm 79 carries a wafer 20 into or out of the chamber. We have found that the slit 78 can alter the process characteristics at the region of the wafer nearest the slit (i.e., near a 90° azimuth in the illustrated chamber) because the volume of process gas reagents available for chemical reactions at that region of the wafer is effectively increased by the volume of process gas inside the slit. For example, in a process for etching a silicon nitride dielectric layer on a wafer using a mixture of $CHF_3$ and $CF_4$ as an etchant, we found a higher etch rate near the perimeter of the wafer closest to the slit valve (i.e., at 90° azimuth). We attribute this azimuthal non-uniformity to the greater volume of fluorine ions being available to etch the dielectric at that location.

In our invention, such azimuthal non-uniformities in process performance can be ameliorated by surrounding the semiconductor wafer or workpiece 20 by an elevated shroud or collar 30a and/or a dielectric inner shield 38 whose shape varies with azimuth so as to offset the azimuthal non-uniformities in process performance due to chamber asymmetries. Specifically, the dielectric inner shield 38 may vary in thickness or inner diameter as a function of azimuth, or the elevated collar 30a may vary in height or in inner diameter as a function of azimuth.

For example, FIGS. 10A–10E show a "wavy" shroud or collar 30a whose height varies with azimuth. The waviness of the collar 30a compensates for the electromagnets 71–74 producing a magnetic field strength near the axis of each electromagnet coil which is lower than the magnetic field strength near the edges 76 of adjacent electromagnet coils. Specifically, the wavy collar 30a has high portions 81 at azimuths which are multiples of 90° (±20°) and has low portions 82 at azimuths which are odd multiples of 45° (±20°). In the illustrated preferred embodiment, the heights of the high and low portions 81 and 82 are 9 mm and 5 mm, respectively. The innermost edge of the wavy collar 30a has flat spots 84 at azimuths of 0° and 90° which mate with corresponding flat spots on the cathode 22 so as to maintain azimuthal alignment of the collar.

We compared the just-described wavy collar 30a with a conventional collar 30 having a uniform height. All tests were performed in an MERIE chamber similar to that shown in FIGS. 9A and 9B with four electromagnets driven in quadrature as described above. Each tested workpiece 20 was a 200 mm diameter silicon wafer on which a layer of silicon dioxide had been deposited by a conventional thermal chemical vapor deposition process. Both the conventional collar and the wavy collar had an inner diameter of 203 mm. The tests measured the spatial uniformity of a process for etching the oxide layer. The etch process parameters were 50 sccm $CHF_3$, 10 sccm $CF_4$, 150 sccm Ar, 250 mTorr chamber pressure, 1000 watts RF power, and 50 Gauss magnetic field strength. In one test which sampled the etch rate at 225 points uniformly distributed over the wafer surface, the one-sigma spatial uniformity of the etch rate was 2.1% with the conventional collar, and 1.5% with the wavy collar, an improvement of 28%. In another test which sampled the etch rate at 17 points at different azimuths near the perimeter of the wafer, the one-sigma spatial uniformity of the etch rate was 8.2% with the conventional collar, and 4.3% with the wavy collar, an improvement of 47%!

With the conventional collar 30, the spatial non-uniformity was caused largely by the etch rate being lower at azimuths which are multiples of 90°, where the magnetic field is weakest. The wavy collar 30a improved the spatial uniformity of etch rate in our tests because its height is greatest at azimuths which are multiples of 90°, thereby increasing the etch rate in those regions where the magnetic field is weakest. We believe the increase in etch rate where the wavy collar 30a is highest is caused by a "focus effect" in which the inner surface 32 of the elevated collar scatters charged particles 36 toward the wafer 20, as illustrated in FIG. 3. Also, we believe the increase in etch rate at the highest portions 81 of the wavy collar can be maximized if the inner surface 32 forms approximately a 135° angle with the plane of the workpiece, as shown in FIG. 3 and as described more fully below.

In some semiconductor fabrication processes, increasing the height of the collar can have the opposite effect of that observed in the silicon dioxide etch process just described. Specifically, increasing the collar height can reduce the process rate by two mechanisms: by obstructing the migration of process gas constituents to the workpiece from regions outside the inner diameter of the collar (the "shadow" or "depletion" effect), and by pushing the plasma axially upward, away from the workpiece. Furthermore, increasing the collar height increases the "residence time" effect which, as discussed previously, can either increase or decrease the process rate, depending on the process. Therefore, when applying the wavy ring to a new process, it may be prudent to measure the process rate (e.g., etch rate or deposition rate, depending on the process) at a number of points around the perimeter of the workpiece to determine whether the process rate increases or decreases adjacent the high portions 81 (or low portions 82) of the wavy ring.

In a process, such as the tested silicon dioxide etch process, in which the focus effect predominates over the confinement effect, we believe the confinement effect may predominate if the collar height is increased further. Specifically, we expect that increasing the collar height beyond a certain point may decrease the process rate due to the confinement effect more than it increases the process rate due to the focus effect. Accordingly, we believe that a solution to the previously described process rate enhancement near the slit 78 would be to make the elevated collar especially high adjacent the slit, so that the high collar will block the migration of reagents between the slit and the workpiece.

An alternative to providing azimuthal variation in the height of the elevated collar is to provide azimuthal variation in the inner diameter of the elevated portion of the collar, that is, to vary the gap between the perimeter of the workpiece 20 and the inner surface 32 of the elevated portion of the collar. Decreasing the inner diameter (i.e., decreasing the gap) generally would change the process rate in the same way as increasing the height of the collar.

Yet another method for offsetting azimuthal variations in the process rate is to provide corresponding azimuthal variations in the axial thickness D or radial width W of the dielectric inner shield 38 which surrounds the perimeter of the workpiece. At azimuths where the chamber non-uniformities or asymmetries would tend to decrease the reaction rate, the dielectric inner shield 38 should be thinner or wider so as to couple more RF power from the cathode electrode 22 to the plasma. Conversely, at azimuths where the chamber non-uniformities or asymmetries would tend to increase the reaction rate, the dielectric inner shield 38 should be thicker or narrower so as to couple less RF power from the cathode electrode 22 to the plasma. The increased RF power coupling through the thinner portions the dielectric inner shield 38 increases the plasma density at those azimuths, and consequently increases the reaction rate at those azimuths. Therefore, azimuthal non-uniformities in the process rate or other process performance parameters can be corrected by fabricating the dielectric inner shield 38 so as to produce offsetting azimuthal variations.

For example, the exemplary process chamber shown in FIG. 9A can cause an azimuthal non-uniformity because the slit 78 provides a greater volume of reagents near the adjacent area of the wafer 20, thereby increasing the reaction rate in that area of the wafer. This non-uniformity can be ameliorated by surrounding the wafer with an annular dielectric inner shield 38 whose thickness is greater near the slit 78 than at other azimuthal locations.

Unlike the elevated collar 30a, the dielectric inner shield 38 need not extend above the plane of the semiconductor workpiece. In fact, it may be advantageous for the dielectric shield to be entirely below the plane of the workpiece to minimize contamination of the workpiece by material which unavoidably deposits on the dielectric shield as a byproduct of the process being performed in the chamber. If the dielectric shield is below the plane of the workpiece, any particles of deposited material which flake off or detach from the dielectric shield will not fall onto the workpiece.

7. Optimal Angle of Dielectric Collar Inner Surface

As stated in the Background of the Invention, a problem with conventional process kits is that they are rapidly eroded by bombardment of ions from the plasma sheath, therefore requiring frequent replacement to maintain consistent process performance. The erosion typically is fastest at the portion of the process kit closest to the perimeter of the wafer. One reason the erosion is fastest there is that ions (depicted by arrow 106 in FIG. 1) bombard the exposed inwardly facing wall 32 of the elevated collar 30 and cause charged particles (depicted by arrow 108) to scatter toward the region 104 near the perimeter of the workpiece 20.

The erosion of exposed surfaces of the process kit near the perimeter of the wafer can be greatly reduced by orienting the exposed inwardly facing surface 32 of the elevated collar or shroud 30 at an angle relative to the central axis of the wafer as shown in FIGS. 2 and 3, this angle preferably being in the range of about 20° to 55°, more preferably about 30° to 45°. Stately differently, the collar's exposed inner surface 32 forms an obtuse angle with the surface of the wafer, this angle being preferably 110° to 145°, and more preferably 120° to 135°. Because of this angular orientation of the collar's inner surface, ions (depicted by arrow 34 in FIG. 3) bombarding the inner surface 32 will tend to cause charged particles (depicted by arrow 36) to scatter laterally toward the central axis of the wafer, rather than scattering downward as in a conventional dielectric collar 30, shown in FIG. 1, whose inner surface 32 is more vertically oriented. Therefore, in our invention the scattered ions will be distributed over a broader area above the wafer, rather than being concentrated at the edge of the wafer as with conventional dielectric collars.

Advantageously, the just described angular orientation will reduce the erosion of the portion of the process kit closest to the edge of the workpiece 20. For example, the portion of the process kit which will enjoy reduced erosion will be the non-dielectric ring 50 in the embodiments of FIGS. 3 and 8A and the non-dielectric ring 60 in the embodiment of FIG. 8B. Additionally, this angular orientation will ameliorate spatial non-uniformity in the plasma process due to any excess of ion density near the perimeter of the workpiece.

Although a 135° angle relative to the surface of the wafer would appear to be ideal because it maximizes the horizontal scattering of charged particles, there may be practical reasons to choose a somewhat different angle in order to optimize spatial uniformity of the plasma-enhanced process. Specifically, a more vertical angle (i.e., closer to 90°) may be desirable when the gap between the wafer perimeter and the inner surface 32 of the shroud is very small.

As illustrated in FIG. 5 and FIG. 7, the elevated collar whose exposed inwardly facing surface faces the workpiece 20 can be a non-dielectric ring 50 rather than a dielectric shield 30. To minimize erosion of the exposed portion of the non-dielectric ring 56 (FIG. 5) or 50 (FIG. 7) adjacent the edge of the workpiece 20, the exposed inwardly facing surface 59 of the non-dielectric ring preferably should be angled relative to the workpiece surface as just described. As illustrated in FIG. 6, the exposed inwardly facing surface of the elevated collar or shroud may include an exposed surface 32 of the elevated dielectric shield 30 together with an exposed surface 59 of the non-dielectric ring 50. In that case, both exposed inwardly facing surfaces 32, 59 preferably should be angled as just described.

8. Other

All references in the specification and claims to directions such as "upper", "lower", "above", and "below" are intended merely to indicate the locations of components relative to each other, and not to indicate the orientation of the components relative to the direction of gravity. The direction of the earth's gravity is irrelevant to this invention. For example, the illustrated designs can be inverted for face down processing of semiconductor wafers, in which case directions described in this patent specification and claims as "upper" and "lower" would actually be "down" and "up", respectively, relative to the direction of the earth's gravity.

When we state that a first component "encircles" or "surrounds" the perimeter of a second component—such as the outer portion of the dielectric shield encircling the perimeter of the protective ring, or the outer portion of the protective ring encircling the perimeter of the workpiece—we do not mean to imply that the two components are coplanar. For example, we describe the outer portion of the protective ring 50 as encircling the perimeter of the wafer 20 in FIG. 3, even though the ring is below the plane of the wafer. Furthermore, we do not intend the term "encircle" to be limited to a circular shape.

One way to define "encircling" or "surrounding" more precisely is that the first component includes an outer portion whose radial position is outside or beyond the perimeter of the second component. Another way to define "encircling" or "surrounding" more precisely is that, when the second component lies substantially in a two-dimensional surface, the projection of the outer portion of the first component onto the surface surrounds the projection of the perimeter of the second component onto that surface. Yet another definition of "encircling" or "surrounding" is that, when the second component has an axis of symmetry, the projection of the outer portion of the first component onto a surface perpendicular to said axis of symmetry surrounds the projection of the perimeter of the second component onto that surface. All of these definitions should be equivalent in the most common situation in which the workpiece is essentially flat. If the workpiece is not flat, then the most appropriate definition will depend on the geometry of the workpiece.

We use the term "ring" to describe an object which encircles an axis, but the ring need not have circular symmetry.

What is claimed is:

1. A workpiece shroud for use in a chamber for plasma-enhanced etching of a workpiece, wherein the chamber includes a cathode electrode having an upper surface facing the workpiece, said shroud comprising:

an annular dielectric shield having an upper surface and a lower surface, wherein a portion of the lower surface is adapted to be positioned on the upper surface of the cathode electrode; and a non-dielectric ring having a lowermost surface positioned on a first annular portion of the upper surface of the dielectric shield.

2. A shroud according to claim 1, wherein:

the dielectric shield further comprises a second annular portion radially outward of the first annular portion; and the second annular portion is not covered by the non-dielectric ring.

3. A shroud according to claim 2, wherein the entire upper surface of the second annular portion of the dielectric shield is higher than the uppermost surface of the non-dielectric ring.

4. A shroud according to claim 1, wherein:

the non-dielectric ring has a planar upper surface; and the dielectric shield includes a radially inward-facing surface in the shape of a transverse segment of a cone;

wherein said inward-facing surface of the dielectric shield is oriented at an obtuse angle relative to the flat upper surface of the non-dielectric ring.

5. A shroud according to claim 1, wherein the entire lowermost surface of the non-dielectric ring is positioned on the upper surface of the dielectric shield.

6. A shroud according to claim 1, wherein the non-dielectric ring is an electrical conductor.

7. A shroud according to claim 1, wherein the non-dielectric ring is a semiconductor.

8. A shroud according to claim 1, wherein the non-dielectric ring is composed of silicon.

9. A workpiece shroud for use in a chamber for plasma-enhanced etching of a workpiece, wherein the chamber includes a cathode electrode having an upper surface facing the workpiece and a first annular dielectric shield covering a radially outer portion of said surface of the cathode electrode, said shroud comprising:

a non-dielectric ring having an uppermost surface that is planar and having a lowermost surface adapted to be positioned on the upper surface of the first dielectric shield; and a second annular shield having an upper surface that radially encircles, and is higher than, the uppermost surface of the non-dielectric ring.

10. A shroud according to claim 9, wherein the first and second dielectric shields are first and second portions of a single, integral dielectric shield.

11. A shroud according to claim 9, wherein:

said upper surface of the second shield includes a radially inward-facing portion in the shape of a transverse segment of a cone;

wherein the inward-facing portion of the upper surface of the second shield is oriented at an obtuse angle relative to the uppermost surface of the non-dielectric ring.

12. A shroud according to claim 9, wherein:

the non-dielectric ring has a radially outer portion and a radially inner portion; and the radially outer portion includes said uppermost surface and is higher than the radially inner portion of the non-dielectric ring.

13. A shroud according to claim 9, wherein the non-dielectric ring is an electrical conductor.

14. A shroud according to claim 9, wherein the non-dielectric ring is a semiconductor.

15. A shroud according to claim 9, wherein the non-dielectric ring is composed of silicon.

16. A shroud according to claim 9, wherein the shield is a dielectric.

17. A workpiece shroud for use in a chamber for plasma-enhanced etching of a workpiece, comprising:

a non-dielectric ring having an uppermost surface; and an annular dielectric shield having an innermost diameter that is greater than the outermost diameter of the non-dielectric ring so that the dielectric shield radially encircles the non-dielectric ring;

wherein the dielectric shield has an upper surface that is higher than the uppermost surface of the non-dielectric ring.

18. A workpiece shroud according to claim 17, wherein:
said upper surface of the shield has a radially inward-facing portion in the shape of a transverse segment of a cone; and
the inward-facing portion of the upper surface of the shield is oriented at an obtuse angle relative to the uppermost surface of the non-dielectric ring.

19. A workpiece shroud according to claim 17:
wherein the non-dielectric ring is a semiconductor.

20. A workpiece shroud according to claim 17:
wherein the non-dielectric ring is silicon.

* * * * *